United States Patent
Iwaki et al.

(10) Patent No.: US 6,885,788 B2
(45) Date of Patent: Apr. 26, 2005

(54) LIGHT-RECEPTION/EMISSION DEVICE BUILT-IN MODULE WITH OPTICAL AND ELECTRICAL WIRING COMBINED THEREIN, METHOD FOR PRODUCING THE MODULE AND ASSEMBLING MEMBER OF THE MODULE

(75) Inventors: Hideki Iwaki, Ibaraki (JP); Yutaka Taguchi, Takatsuki (JP); Tetsuyoshi Ogura, Settu (JP); Yasuhiro Sugaya, Toyonaka (JP); Toshiyuki Asahi, Osaka (JP); Tousaku Nishiyama, Nara (JP); Yoshinobu Idogawa, Sakai (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/609,494

(22) Filed: Jun. 20, 2003

(65) Prior Publication Data

US 2004/0001661 A1 Jan. 1, 2004

(30) Foreign Application Priority Data

Jun. 28, 2002 (JP) ........................................ 2002-189327

(51) Int. Cl.⁷ .......................... G02B 6/10; G02B 6/12; G02B 6/26; G02B 6/42
(52) U.S. Cl. ........................... 385/15; 385/14; 385/50; 385/51; 385/129; 385/130; 385/131; 257/79; 257/80; 257/81; 257/82; 257/83; 257/84; 257/99; 257/100; 257/428; 257/431; 257/432; 257/433
(58) Field of Search ................... 385/14, 15, 50, 385/51, 129–131, 59; 257/79–99, 100, 428–433

(56) References Cited

U.S. PATENT DOCUMENTS 5,357,122 A  10/1994  Okubora et al.
5,465,315 A  * 11/1995  Sakai et al. .................. 385/116
5,911,018 A  *  6/1999  Bischel et al. .................. 385/16
6,215,585 B1   4/2001  Yoshimura et al.
6,477,284 B1  11/2002  Oda et al.
6,477,286 B1  11/2002  Ouchi
6,574,408 B2  *  6/2003  Lemaire et al. ............. 385/127
2002/0076161 A1 *  6/2002  Hirabayashi et al. ......... 385/40
2003/0002138 A1 *  1/2003  DeCusatis et al. .......... 359/334
2004/0001661 A1 *  1/2004  Iwaki et al. .................. 385/14

FOREIGN PATENT DOCUMENTS

| EP | 1 219 994 | 7/2002 |
|---|---|---|
| JP | 5-67770 | 3/1993 |
| JP | 2001-36197 | 2/2000 |
| JP | 2000-332301 | 11/2000 |
| JP | 2000-340907 | 12/2000 |
| JP | 2002-6161 | 1/2002 |

* cited by examiner

Primary Examiner—John R. Lee
Assistant Examiner—Bernard E. Souw
(74) Attorney, Agent, or Firm—Merchant & Gould P.C.

(57) ABSTRACT

A light reception/emission device built-in module with optical and electrical wiring combined therein includes: an optical waveguide layer including a core portion and a cladding portion; first and second wiring patterns formed on a main surface of the optical waveguide layer; a light reception device disposed inside the optical waveguide layer, the light reception device being optically connected with the core portion of the optical waveguide layer and being electrically connected with the first wiring pattern; and a light emission device disposed inside the optical waveguide layer, the light emission device being optically connected with the core portion of the optical waveguide layer and being electrically connected with the second wiring pattern. With this configuration, optical coupling between the optical waveguide and the light reception/emission device can be conducted precisely.

17 Claims, 8 Drawing Sheets

LIGHT-RECEPTION/EMISSION DEVICE BUILT-IN MODULE WITH OPTICAL AND ELECTRICAL WIRING COMBINED THEREIN, METHOD FOR PRODUCING THE MODULE AND ASSEMBLING MEMBER OF THE MODULE

BACKGROUND OF THE INVENTION

1. Field of the Invention

The present invention relates to a light reception/emission device built-in module with optical and electrical wiring combined therein, in which a semiconductor device for light reception/emission is built in an optical and electrical wiring combined wiring board provided with an optical waveguide portion and an electrical wiring portion. The present invention also relates to a method for producing the module and an assembled member of the module.

2. Related Background Art

In recent years, in order to realize communication with larger capacity and signal processing at a higher speed, optical interconnection technology that links integrated circuits with an optical waveguide has been developed as a method for exceeding the limit of electrical wiring. The conventional optical interconnection technology, as disclosed in JP 2000-340907 A, employs a wiring board formed by embedding a fibrous optical waveguide member therein as a wiring board for providing optical wiring serving as an optical waveguide in the board.

Furthermore, a configuration for carrying out optical coupling between a light reception/emission device and an optical waveguide includes, as disclosed in JP 5(1993)-67770 A, an optoelectronic IC chip with a light-emission device packaged therein, which is packaged in an optical wiring board equipped with an optical waveguide and a reflective mirror.

Furthermore, JP 2000-332301 A discloses a configuration in which an end portion of an optical waveguide is processed so as to form an angle of 45° with respect to incoming and outgoing light with respect to a surface emission optical device, and the 45° end face is coated with a metal film and the like so as to function as a reflective mirror, by which the optical path of incoming/outgoing light with respect to the surface emission optical device is changed by 90° into a core layer of the optical waveguide in order to allow the optical coupling.

However, the conventional configuration for optical coupling of the optical device and the optical waveguide using the reflective mirror to allow the optical path to be changed by 90° requires the reflective mirror to be included in the optical waveguide. In addition, when a semiconductor device and a circuit component other than the optical device also are to be packaged on a board with the optical waveguide formed therein by the surface packaging technology for the purpose of electric connection, the optical coupling portion might suffer from the contamination by flux and the like included in eutectic solder that is normally used during a manufacturing process, in particular, during a reflow process, which reduces the optical coupling efficiency. For that reason, the surface packaging of an optical device that is optically coupled with an optical waveguide has to be carried out with a specific process that does not use flux or the like.

Moreover, in addition to the necessity for addressing this problem, to transmit signals at high frequencies between an optical device and a semiconductor device for driving of the optical device or for amplifying signals requires electrical wiring over a short distance.

SUMMARY OF THE INVENTION

Therefore, with the foregoing in mind, it is an object of the present invention to provide a light reception/emission device built-in module with optical and electrical wiring combined therein, by which optical coupling is conducted without using an optical device such as a reflective mirror between an optical device and an optical waveguide, and to provide a method for producing the module and an assembled member of the module.

To fulfill the above-stated object, a light reception/emission device built-in module with optical and electrical wiring combined therein of the present invention includes: an optical waveguide layer including a core portion and a cladding portion; first and second wiring patterns formed on a main surface of the optical waveguide layer; a light reception device disposed inside the optical waveguide layer, the light reception device being optically connected with the core portion of the optical waveguide layer and being electrically connected with the first wiring pattern; and a light emission device disposed inside the optical waveguide layer, the light emission device being optically connected with the core portion of the optical waveguide layer and being electrically connected with the second wiring pattern.

A method for producing a light reception/emission device built-in module with optical and electrical wiring combined therein of the present invention includes the steps of: forming a through hole in an optical waveguide layer including a core portion and a cladding portion; forming a plurality of wiring patterns on a main surface of a releasing film and packaging a light reception device and a light emission device on the wiring patterns; aligning the releasing film so that the wiring patterns face a side of the optical waveguide layer and overlaying the same on the optical waveguide layer, followed by application of pressure, so that the light reception device or the light emission device is disposed in the through hole in the optical waveguide layer; filling the through hole with a resin that is transparent with respect to light propagating through the core portion; and curing the resin.

An assembled member including a light reception/emission device built-in module with optical and electrical wiring combined therein of the present invention includes: an optical waveguide layer including a core portion and a cladding portion; first and second wiring patterns formed on a main surface of the optical waveguide layer; a light reception device disposed inside the optical waveguide layer, the light reception device being optically connected with the core portion of the optical waveguide layer and being electrically connected with the first wiring pattern; a light emission device disposed inside the optical waveguide layer, the light emission device being optically connected with the core portion of the optical waveguide layer and being electrically connected with the second wiring pattern; and a driving device and an amplification device that are packaged in the optical waveguide layer. In this assembled member, the light emission device is electrically connected with the driving device via the second wiring pattern and the light reception device is electrically connected with the amplification device via the first wiring pattern.

DETAILED DESCRIPTION OF THE INVENTION

Figure 1:
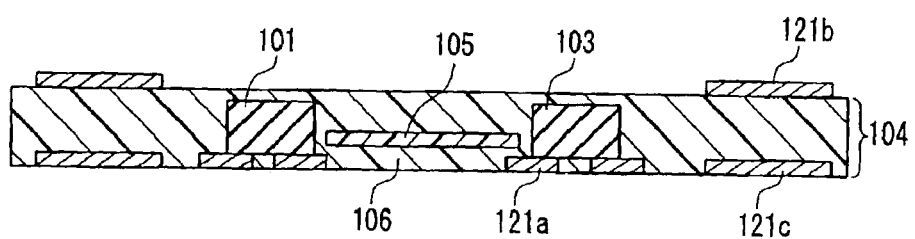
FIG. 1 is a cross-sectional view schematically showing a configuration of a first light reception/emission device built-in module with optical and electrical wiring combined therein according to Embodiment 1 of the present invention.

According to the present invention, a core portion is embedded in a cladding portion so as to form an optical waveguide layer. Wiring patterns are formed on at least one main surface of the optical waveguide layer. A light reception device and a light emission device also are embedded in a resin as the cladding portion and each is electrically connected with a wiring pattern. Thereby, the optical coupling between the optical waveguide and the light reception/emission device can be conducted without providing an optical path changing unit using a reflective mirror formed on an end face of the optical waveguide for changing the optical path by 90°. In addition, circuit components can be packaged for the electrical connection on a board with the optical waveguide formed therein by surface packaging technology utilizing a solder involving a flux or the like.

Preferably, in the above module, the light reception device and the light emission device are disposed at positions in the optical waveguide layer so that optical input and output are conducted in a direction parallel to a plane on which the core portion of the optical waveguide layer is formed. With this configuration, the optical input and output are conducted with respect to the light reception/emission device in the direction parallel to the plane on which the core portion is formed, and therefore the optical coupling can be conducted without providing an optical path changing unit for changing the traveling direction of the light between the optical waveguide and the light reception/emission device.

In the above module, preferably, the light emission device is configured with a surface emission type laser. With the use of the surface emission type laser, the distribution of the intensity of light emitted from the light emission device concentrates on a narrower angle as compared with an end face emission type, and therefore the optical coupling efficiency between the core portion of the optical waveguide and the light emission device can be improved.

In the above module, preferably, an end face of the core portion of the optical waveguide layer is optically connected with the light reception device or the light emission device via a light-transmitting resin material. By conducting the optical coupling of the end face of the core portion of the optical waveguide with the light reception/emission device via the light-transmitting resin material, the reflection of optical signals from the end face of the optical waveguide core portion or the optically connecting surfaces of the light reception device or the light emission device can be reduced, and the optically coupling efficiency between the optical waveguide core portion and the light reception device or the light emission device can be improved. Furthermore, the fight reception device or the light emission device can be protected from the surroundings.

In the above module, preferably, a third wiring pattern is formed on the other main surface of the optical waveguide layer. In addition, preferably, a circuit component is packaged on the third wiring pattern.

Preferably, the above module further includes an insulation board made of a mixture containing an inorganic filler and a thermosetting resin on at least one side of the optical waveguide layer.

In the present invention, there may be a plurality of the core portions. This is for realizing higher density. Among the plurality of core portions, at least two core portions may be disposed in the same plane. Furthermore, at least three end faces of end faces of the plurality of core portions may be disposed in the same plane. Furthermore, at least three end faces of end faces of the plurality of core portions may be disposed on a substantially same line.

There may be a plurality of the optical waveguide layers. This is for realizing higher density. It is preferable that end faces of core portions of the plurality of optical waveguide layers have a concave form or a convex form. This is for facilitating the optical coupling.

In the module according to the present invention, it is preferable that the light reception device, the light emission device and the optical waveguide layer are all embedded in an electrical insulation layer. With this configuration, when these elements are embedded in the electrical insulation layer, positional alignment of the light reception device, the light emission device and the optical waveguide layer can be conducted precisely, and a module with favorable ease of handling can be obtained.

According to the producing method of the present invention, the light reception/emission device built-in module with optical and electrical wiring combined therein of the present invention can be produced easily.

According to the assembled member of the present invention, the wiring length between the light reception device or the light emission device and the driving device or the amplification device can be shortened, and the cut-off frequency of the frequency property concerning the transmission properties can be increased.

In the above assembled member, preferably, an anode terminal and a cathode terminal of the light emission device are both electrically connected with the driving device via the second wiring pattern and an anode terminal and a cathode terminal of the light reception device are both electrically connected with the amplification device via the first wiring pattern. The wiring length between the light reception device or the light emission device and the driving device or the amplification device can be shortened further, and the cut-off frequency of the frequency property concerning the transmission properties can further be increased.

According to the module of the present invention, the optical coupling between the optical waveguide and the light reception/emission device can be conducted without providing an optical path changing unit using a reflective mirror formed on an end face of the optical wave guide for changing the optical path by 90°. In addition, circuit components can be packaged for the electrical connection on a board with the optical waveguide formed therein by surface packaging technology utilizing a solder involving a flux or the like.

In addition, the optical input and output are conducted with respect to the light reception/emission device in the direction generally parallel to the plane on which the core portion is formed, and therefore the optical coupling can be conducted without providing an optical path changing unit for changing the traveling direction of the light between the optical waveguide and the light reception/emission device. In addition, with the use of the surface emission type laser, the distribution of the intensity of light emitted from the light emission device concentrates on a narrower angle as compared with an end face emission type, and therefore the optical coupling efficiency between the core portion of the optical waveguide and the light emission device can be improved.

According to the assembled member of the present invention, the wiring length between the light reception device or the light emission device and the driving device or the amplification device can be shortened, and the cut-off frequency of the frequency property concerning the transmission properties can be increased.

The following describes embodiments of the present invention in detail, with reference to FIGS. 1 to 15. In the following drawings, the same reference numeral denotes the same element. Note here that the present invention is not limited to the following embodiments.

Embodiment 1

FIG. 1 is a cross-sectional view schematically showing a configuration of a light reception/emission device built-in module with optical and electrical wiring combined therein according to Embodiment 1 of the present invention.

In FIG. 1, a light reception device 101 and a light emission device 103 are each electrically connected with an end of a wiring pattern 121a that is provided in an optical waveguide layer 104 so as to be packaged therein. The other end of the wiring pattern 121a is exposed to the outside of the optical waveguide layer 104. An optical waveguide core portion 105 is optically coupled to the light reception device 101 and to the light emission device 103. In addition, the light reception device 101 and the light emission device 103 are embedded in the optical waveguide layer 104. On another surface of the optical waveguide layer 104, wiring patterns 121b and 121c are formed.

The optical waveguide core portion 105 is made of a polymer that is transparent with respect to each of the wavelengths of light received by the light reception device 101 and the wavelengths of light emitted by the light emission device 103. In particular, polymethyl methacrylate, polyimide, polysilane, benzocyclobutene resin, epoxy resin, siloxane resin, polycarbonate and the like can be used. As the light reception device 101 and the light emission device 103, a compound semiconductor device such as GaAs based and InP based devices can be used, whose reception and emission wavelengths may be, for example, 780 nm, 850 nm, 1.3 $\mu$m and 1.5 $\mu$m.

The optical waveguide can be manufactured by direct writing using an electron beam or a laser beam, injection molding or press molding, in addition to by a method of photolithography and etching or a method of UV curing. The optical waveguide core layer can be formed in a rectangular form by the above-described methods, and a single mode size having a core size approximately from 8 to 10 $\mu$m and a multi mode size having a core size approximately from 40 to several hundreds $\mu$m are available. Particularly, when an end face of the optical waveguide core layer for the optical coupling with the light reception device or the light emission device is treated to have an aspheric surface during the above-described manufacturing process of the optical waveguide, this treatment can improve the optical coupling efficiency between the light reception/emission devices and the optical waveguide core layer.

The light reception device 101 and the light emission device 103 are disposed in the optical waveguide layer 104 in such a manner that optical input and output are carried out in a direction generally parallel to a plane on which the optical waveguide core portion 105 is formed.

Especially, a light emission surface of the light emission device 103 with which the optical waveguide core portion 105 is optically coupled is packaged so that the light emission surface forms an angle within a right angle ±10° with respect to an optical axis of the optical waveguide core portion 105. When the angle formed is within a right angle ±10°, an influence by so-called return light, which is the light emitted from the light emission device 103 and then returning to the light emission device 103 by the reflection from the end face of the optical waveguide core portion 105, can be reduced. Even in the case of the angle beyond the range, it is possible to reduce the influence by the return light. However, since the optical coupling efficiency between the optical waveguide core layer and the light emission device deteriorates, the angle within a right angle ±10° is preferable and the angle within a right angle ±1 to 3° is the most preferable.

As the light emission device, an end face emission type or a surface emission type semiconductor laser can be used. In the case of the surface emission type, the light emission device is configured with a light emission portion and a sub carrier portion, where the light emission portion is provided with an active layer manufactured with a semiconductor made of GaAs, InP, InGaAs, InGaAsP or the like and the sub carrier portion is made of a material selected from Si, AlN, SiC or the like that has approximately the same thermal expansion coefficient as that of the light emission portion. The surface emission type light emission portion is provided on the side of the sub carrier portion.

An electrode of the light emission portion is connected with a wiring pattern via an electrode provided in the sub carrier portion. In the case of the configuration including the surface emission type light emission device, the distribution of the intensity of light emitted from the light emission device concentrates on a narrower angle as compared with the end face emission type, and therefore the optical coupling efficiency between the core portion of the optical waveguide and the light emission device is improved. In the case of the end face emission type semiconductor laser, when a spot size changing function is incorporated in the emission end of the semiconductor laser, this function enables the light intensity distribution to concentrate on a narrow angle, thus improving the optical coupling efficiency between the core portion of the optical waveguide and the light emission device.

The optical waveguide layer 104 includes the optical waveguide core portion 105 and the optical waveguide cladding layer 106, and the optical waveguide core portion 105 is made of a polymer that is transparent with respect to each of the wavelengths of light received by the light reception device 101 and the wavelengths of light emitted by the light emission device 103. In particular, polymethyl methacrylate, fluorinated polyimide, benzocyclobutene resin, epoxy resin, siloxane resin, polycarbonate and the like can be used. For the optical waveguide cladding layer 106 also, polymethyl methacrylate, fluorinated polyimide, benzocyclobutene resin, epoxy resin, siloxane resin, polycarbonate and the like can be used as in the optical waveguide core layer. However, a difference in refractive index between materials of the optical waveguide cladding layer and the optical waveguide core layer is controlled so that the optical waveguide core layer has a refractive index higher than that of the optical waveguide cladding layer.

When fluorinated polyimide is used for the optical waveguide cladding layer 106, the optical waveguide core layer can be made of another fluorinated polyimide having a difference in refractive index adjusted so that the refractive index of the optical waveguide core layer is higher than that of the optical waveguide cladding layer. Alternatively, when polysilane is used for the optical waveguide cladding layer, a material whose refractive index changes with the irradiation of light may be used. For instance, a material whose refractive index increases with the irradiation of UV light may be used, and an optical waveguide core layer may be formed by the exposure to light through a mask so as to have a refractive index higher than that of an optical waveguide cladding layer.

Figure 2:
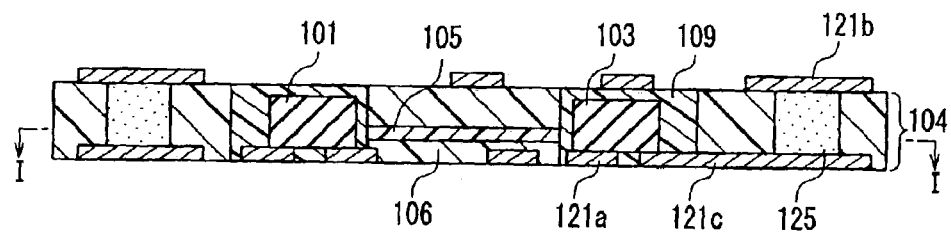
FIG. 2 is a cross-sectional view schematically showing a configuration of a second light reception/emission device built-in module with optical and electrical wiring combined therein according to Embodiment 1 of the present invention.

Furthermore, as shown in FIG. 2, an end face of a core portion of an optical waveguide may be optically connected with a light reception device or a light emission device through a light transmitting resin 109. In this case, a material that is transparent with respect to a transmitted or a received optical signal can be used as a material of the light-transmitting resin 109 such as a silicone based and an acrylate based resin material. In particular, the use of a light-transmitting resin material having a refractive index close to the refractive index of the core layer of the optical waveguide is preferable. Especially, the use of a material having the same refractive index as that of the optical waveguide core portion, such as polymethyl methacrylate, polyimide, benzocyclobutene resin, epoxy resin, siloxane resin, polycarbonate, is the most preferable. With this configuration, the reflection of optical signals from the end face of the optical waveguide core portion or the optically connecting surfaces of the light reception device and the light emission device can be reduced, and the optically coupling efficiency between the optical waveguide core portion and the light reception device or the light emission device can be improved. Furthermore, the light reception device and the light emission device can be protected from the surroundings. Those effects can be obtained when the light-transmitting resin material is formed at least between the end face of the core portion of the optical waveguide and the optically connecting surface of the light reception device or the light emission device, or the light-transmitting resin material may be filled so as to surround the light reception device or the light emission device. In such a case, since the light emission/reception devices can be isolated from the external atmosphere, the degradation in reliability of the light reception/emission devices due to humidity and the like can be avoided.

Figure 3:
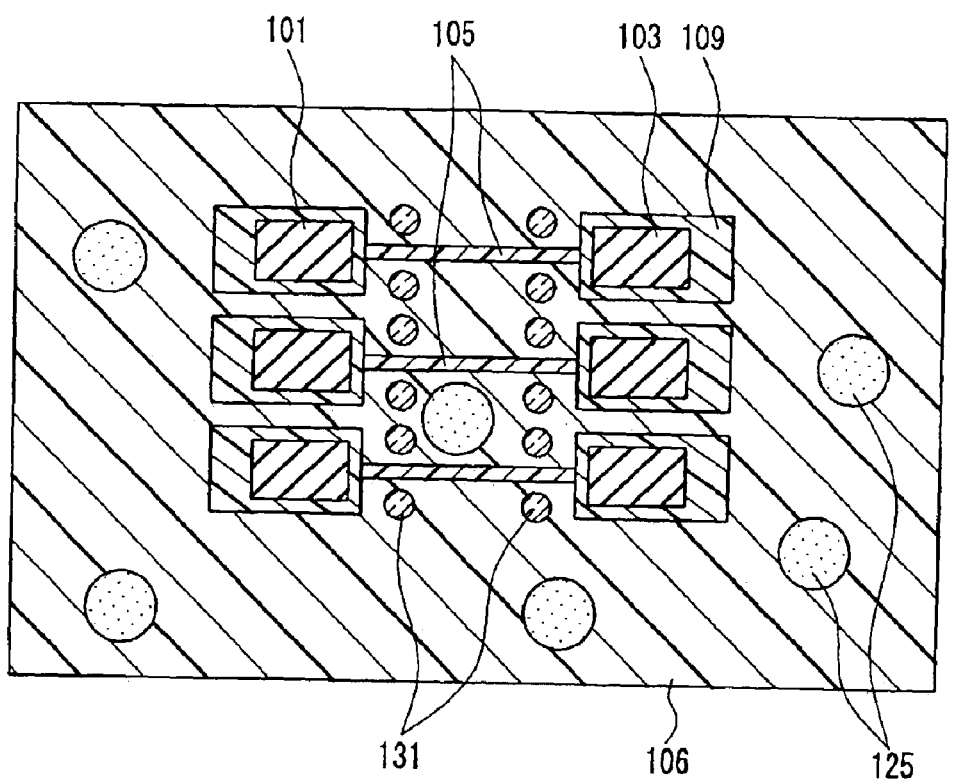
FIG. 3 is a cross-sectional view taken along line I—I of FIG. 2.

FIG. 3 is a cross-sectional view taken along line I—I of FIG. 2. In this example, three optical waveguide core portions 105, three light reception devices 101 and three light emission devices 103 are arranged parallel with each other on the same plane. This configuration can realize a higher-density and higher-integration module. A marker 131 may be formed through the same process as that the optical waveguide core portion 105 experiences, and may be made of the same material as that of the optical waveguide core portion 105 and have the same refractive index. The marker may be formed in a circular form with a diameter 1 to 5 times the width of the optical waveguide core portion 105. By setting this marker 131 as the positional reference, the light reception device 101 or the light emission device 103 and the optical waveguide core portion 105 are aligned so as to be optically coupled with each other, and then are packaged.

Figure 4:
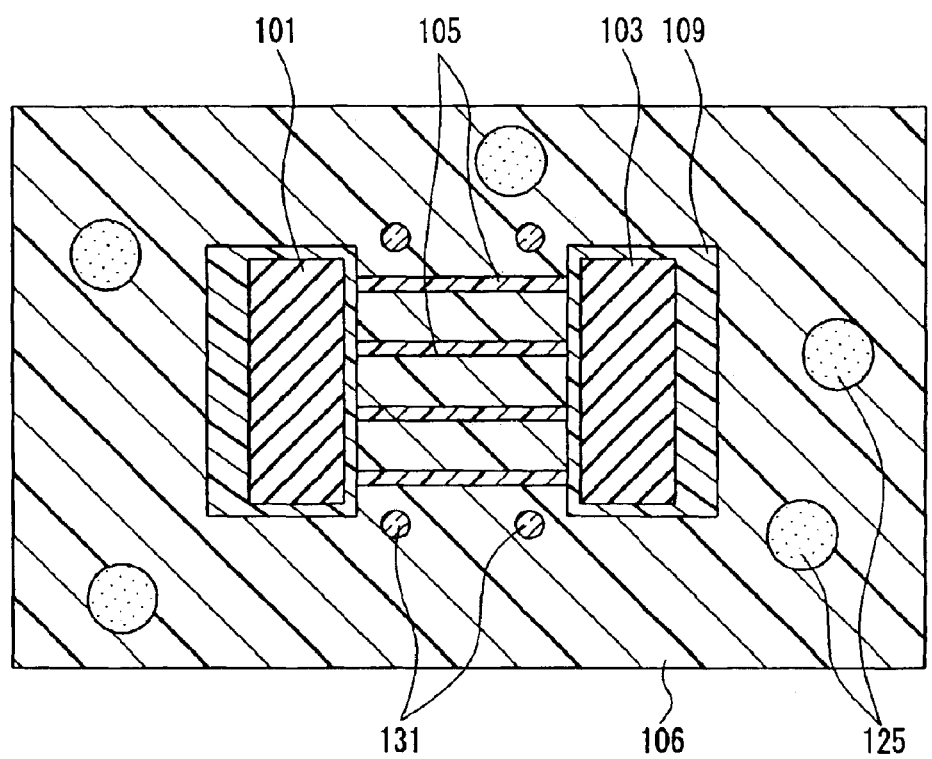
FIG. 4 is a cross-sectional view showing another example, which corresponds to the view taken along line I—I of FIG. 2.

FIG. 4 is a cross-sectional view showing another example, which corresponds to the view taken along line I—I of FIG. 2. In this example, four optical waveguide core portions 105 are arranged parallel with each other on the same plane, and one light reception device 101 and one light emission device 103 are arranged thereon. In this example, four end faces of the core portions are arranged on the same line. This configuration further realizes a higher-density and higher-integration module.

Figure 5:
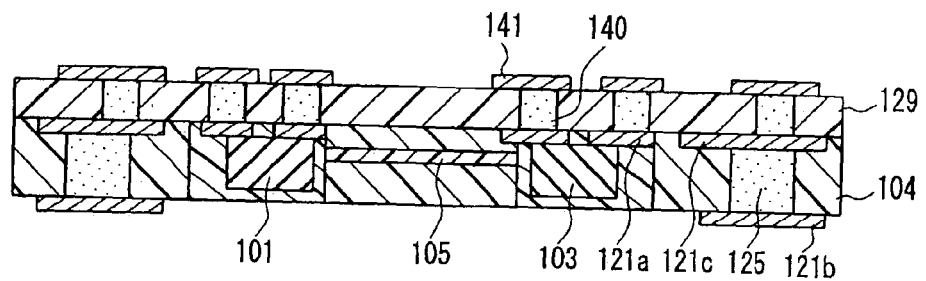
FIG. 5 is a cross-sectional view schematically showing a configuration of a third light reception/emission device built-in module with optical and electrical wiring combined therein according to Embodiment 1 of the present invention.

As shown in FIG. 5, the module may be configured to include an insulation board 129 that is made of a mixture of an inorganic filler and a thermosetting resin on at least one side of the optical waveguide layer.

In such a case, the rigidity of the optical waveguide layer 104 and the insulation board 129, which are integrated with each other, is improved. As a result, cracks, breakage and the like of the light reception/emission devices 101 and 103, which are caused by the external stress applied to the light reception/emission devices that are provided by embedding inside the optical waveguide layer 104, can be decreased. Reference numeral 140 denotes an inner via hole formed in the insulation board 129 and 141 denotes a wiring pattern provided on a surface of the insulation board 129. The preferable thickness of the insulation board 129 ranges from 50 $\mu$m to 400 $\mu$m.

The inorganic filler can be selected from $Al_2O_3$, MgO, BN, SiC, AlN and $SiO_2$. By using these inorganic fillers, a light reception/emission device built-in module with optical and electrical wiring combined therein having excellent heat dissipation capabilities can be obtained. Note here that the content of the inorganic filler preferably is set so that 70 to 95 weight % of inorganic filler is present in the mixture. As for the thermosetting resin, for example, 5 to 30 weight % of epoxy resin is preferably mixed thereto.

By selecting the inorganic filler, a coefficient of thermal expansion of the electrical insulating board can be adjusted to match that of the light reception/emission devices, so that the light reception/emission device built-in module with optical and electrical wiring combined therein having high reliability can be obtained.

Figure 6:
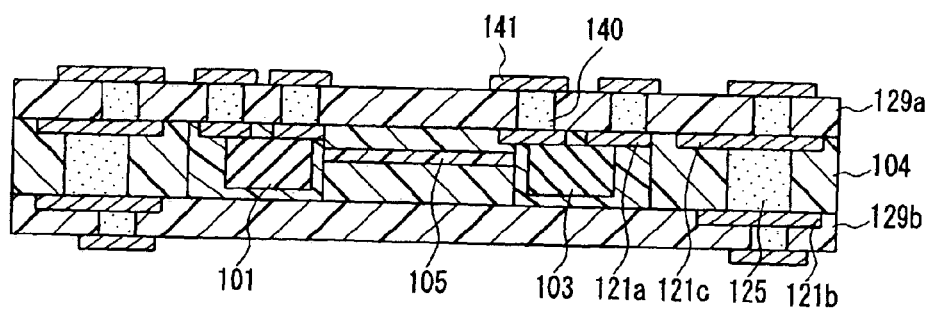
FIG. 6 is a cross-sectional view schematically showing a configuration of a fourth light reception/emission device built-in module with optical and electrical wiring combined therein according to Embodiment 1 of the present invention.

Furthermore, as shown in FIG. 6, insulation boards 129a and 129b that are made of a mixture containing an inorganic filler and a thermosetting resin may provided on both sides of the optical waveguide layer 104. In such a case, the generation of warp, which results from a difference in thermal expansion coefficient between the optical waveguide layer and the insulation board, can be suppressed. The preferable thicknesses of the insulation boards 129a and 129b respectively range from 50 μm to 400 μm. The insulation boards 129a and 129b may be made of the same materials as those described referring to FIG. 5.

As the insulation board, a board including electrical wiring patterns formed across a plurality of layers may be used. With this configuration, circuit components can be mounted on the insulation board integrated with the optical waveguide layer. Since the generation of the warp is suppressed, the circuit components can be packaged with stability.

Furthermore, by providing a ceramic board that is made of an inorganic material selected from the group consisting of $Al_2O_3$, MgO, BN, SiC and AlN on at least one side of the optical waveguide layer, the rigidity of a laminated member of the optical waveguide layer and the ceramic board further can be improved. Moreover, by selecting the inorganic material so as to match a coefficient of thermal expansion of the light reception/emission devices, the stress applied to the light reception/emission devices caused by a difference in thermal expansion coefficient can be avoided, so that a light reception/emission device built-in module with optical and electrical wiring combined therein having high reliability can be obtained.

By using as a material of the insulation board a material that does not allow transmitted or received optical signals to pass through, the influence of noise that might be incident on the optical waveguide layer from the outside can be avoided. Therefore, when insulation boards made of a material that does not allow the light to pass through are provided on both sides of the optical waveguide layer, the influence of optical noise from the surroundings can be reduced as compared with the case where such an insulation board is provided on one side of the optical waveguide layer. Additionally, noise from stray light from the light emission device also can be blocked.

When circuit components are packaged on the above-described light reception/emission device built-in module with optical and electrical wiring combined therein for the purpose of electrical connection, the surface packaging technology utilizing solder involving flux or the like does not affect the optical coupling portion between the optical waveguide and the light reception/emission device. This is because the optical coupling portion linking the optical waveguide and the light reception/emission device is disposed inside the module. Additionally, the optical coupling between the optical waveguide and the light reception/ emission device can be carried out only within the light reception/emission device built-in module with optical and electrical wiring combined therein, and therefore the circuit components can be packaged for the electrical connection without the requirement for optical coupling, and other circuit components can be mounted on the module using currently available surface packaging technology and facilities. As the circuit components, for example, a capacitor, an inductor, a resistor, a semiconductor chip, CSP (chip size package) and the like can be used.

Embodiment 2

FIGS. 7A to I are cross-sectional views schematically showing a method for producing a light reception/emission device built-in module with optical and electrical wiring combined therein according to Embodiment 2 of the present invention. The following describes the method for producing the light reception/emission device built-in module with optical and electrical wiring combined therein according to this embodiment, with reference to FIGS. 7A to I.

Figure 7A:
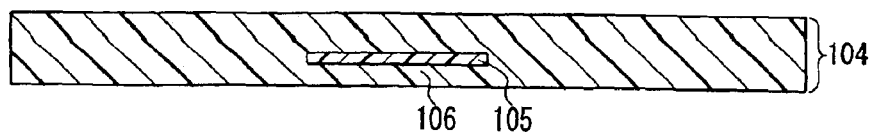
FIGS. 7A to I are cross-sectional views schematically showing a method for producing a light reception/emission device built-in module with optical and electrical wiring combined therein according to Embodiment 2 of the present invention.

Firstly, as shown in FIG. 7A, an optical waveguide layer 104 is prepared in which an optical waveguide cladding layer 106 is formed so as to surround an optical waveguide core portion 105. As for the optical waveguide layer 104, a film form optical waveguide film can be used. As the optical waveguide film, a film formed by press molding can be used in which a concave portion for forming the optical waveguide core layer is provided in a film made of polycarbonate or the like serving as an optical waveguide lower cladding layer by pressing using a mold, polymer serving as the optical waveguide core layer is filled in the concave portion, where a refractive index of the polymer is higher than that of the optical waveguide cladding layer, and an optical waveguide upper cladding layer is formed with the same material as that of the optical waveguide lower layer. Alternatively, an ultraviolet-light irradiation curing optical waveguide film that makes use of a resin material whose refractive index increases with the irradiation of UV light can be used.

Figure 7B:
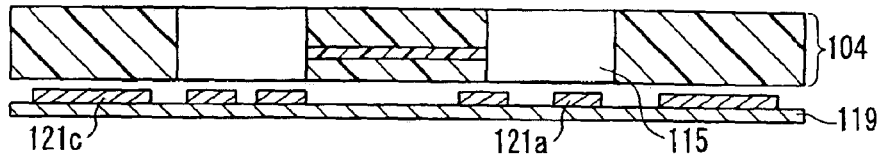

Next, as shown in FIG. 7B, a first through hole 115 is formed at a desired position of the optical waveguide layer 104. The first through hole can be formed by, for example, laser processing or processing using a mold. The laser processing is preferable because this method can form the first through hole 115 with a fine pitch and does not generate swarf. As for the laser processing, $CO_2$ laser and excimer laser facilitate the processing.

From a side face of the first through hole 115, an end face of the optical waveguide core portion 105 is exposed. The first through hole 115 preferably is formed at a region where a light reception device and a light emission device are to be packaged so that the optical waveguide core portion 105 and the light reception device or the light emission device are optically coupled with each other, as described later. In addition, at the same time, a releasing film 119 with wiring patterns 121a and 121c formed thereon is aligned and overlaid with respect to the optical waveguide layer 104 in which the first through hole 115 is formed.

As the releasing film 119, for example, a film made of polyethylene terephthalate or polyphenylene sulfide can be used. The wiring patterns 121a and 121c can be formed, for example, by bonding copper foil to the releasing film 119, followed by a photolithography process and an etching process. Instead of the copper foil, a metal thin film also can be used. In these processes, the wiring patterns 121a and 121c that correspond to the arrangement of electrodes of the light reception device and the light emission device are transferred at a region that corresponds to the through hole 115 in which the light reception device and the light emission device are to be mounted.

Figure 7C:
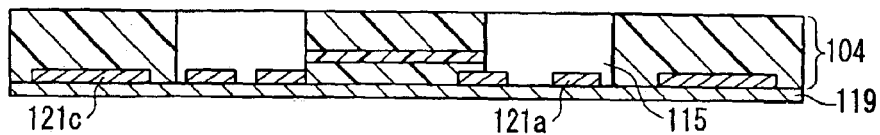

Thereafter, as shown in FIG. 7C, pressure and heat are applied to the result obtained by aligning and overlaying these elements, so that a lamination member of the optical waveguide 104 and the wiring patterns 121a and 121c can be obtained.

Figure 7D:
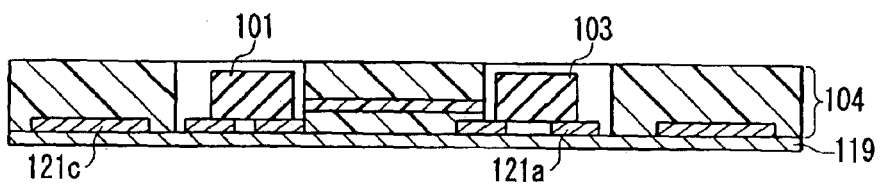

Thereafter, as shown in FIG. 7D, the light reception device and the light emission device are mounted on the wiring patterns 121a and 121c so as to establish the optical coupling between the optical waveguide core portion 105 and the light reception/emission devices. In this process, alignment markers for positional alignment may be formed on the wiring patterns 121a and 121c or on the optical waveguide layer 104, which facilitates the mounting of the light reception device and the light emission device. Then, after the light reception device and the light emission device are mounted, the releasing film 119 is peeled off. This releasing film 119 may be peeled off after the completion of the module.

Figure 7E:
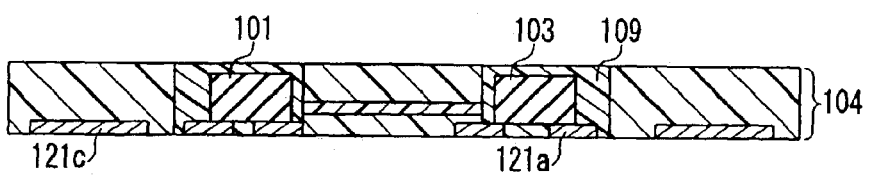

Thereafter, as shown in FIG. 7E, the first through hole 115 is filled with a light-transmitting resin 109 by a printing method or the like. In the case where the light-transmitting resin 109 is a photo-setting type or a photo and thermo-setting type, the first through hole 115 is filled with the light-transmitting resin 109, followed by curing with the irradiation of light. In the case of the thermo-setting type, the curing is conducted during the heating process, which will be described later.

As the light-transmitting resin, a material whose refractive index matches that of the optical waveguide core layer can be used. For example, the refractive index of the light-transmitting resin can be selected in a range of ±0.05 of the refractive index of the optical waveguide core layer. The preferable range is ±0.01. For instance, the use of fluorinated epoxy group, acrylic group, brominated epoxy group, sulfur-containing vinyl group and the like allows the refractive index to be controlled freely in a range of 1.40 to 1.71 with the precision of ±0.005. In addition to the resin that cures by UV light and heating, a gel form resin that does not cure also can be used.

Figure 7F:
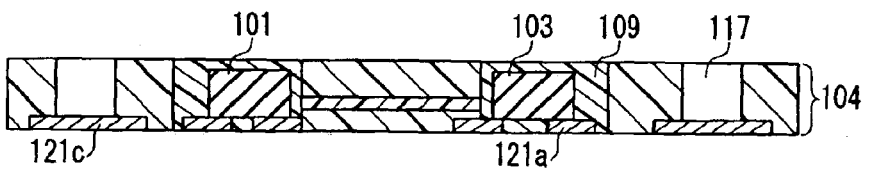
Figure 7G:
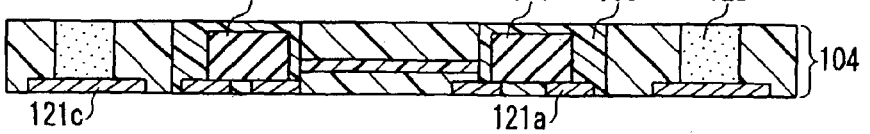
Figure 7H:
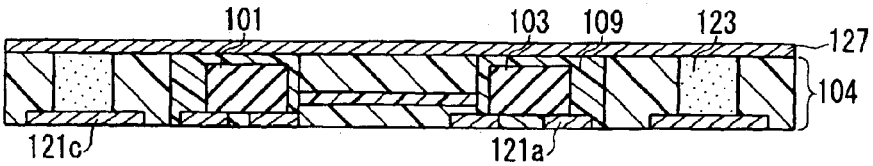

Thereafter, as shown in FIG. 7F, a second through hole 117 is formed by laser processing or the like, and as shown in FIG. 7G, the second through hole 117 is filled with a conductive resin composition 123. Subsequently, as shown in FIG. 7H, copper foil 127 is aligned and overlaid thereto, followed by the application of pressure and heat, so that the thermosetting resin contained in the conductive resin composition 123 is cured so as to form a via conductor 125. The heating applied is set at a temperature not less than a curing temperature of the thermosetting resin in the conductive resin composition 123 (e.g., 150 to 260° C.). Through this process, the copper foil 127 and the optical waveguide layer 104 are bonded with each other mechanically.

Figure 7I:
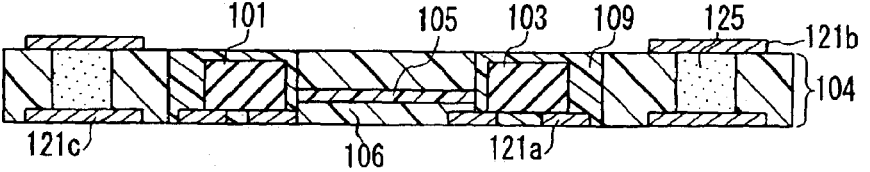

The via conductor 125 establishes the electrical connection with the copper foil 127. After that, as shown in FIG. 7I, the copper foil 127 is processed so as to form the wiring patterns. In this way, the light reception/emission device built-in module with optical and electrical wiring combined therein described in Embodiment 1 can be formed.

According to the above-described manufacturing method, the light reception/emission device built-in module with optical and electrical wiring combined therein described in Embodiment 1 can be manufactured easily. Alternatively, in the case where a material exhibiting a gel state after the curing is used as the light-transmitting resin in the above manufacturing process, the stress applied to the light reception/emission devices caused by a temperature change can be mitigated, so that a light reception/emission device built-in module with optical and electrical wiring combined therein having high reliability can be obtained.

Embodiment 3

Figure 8:
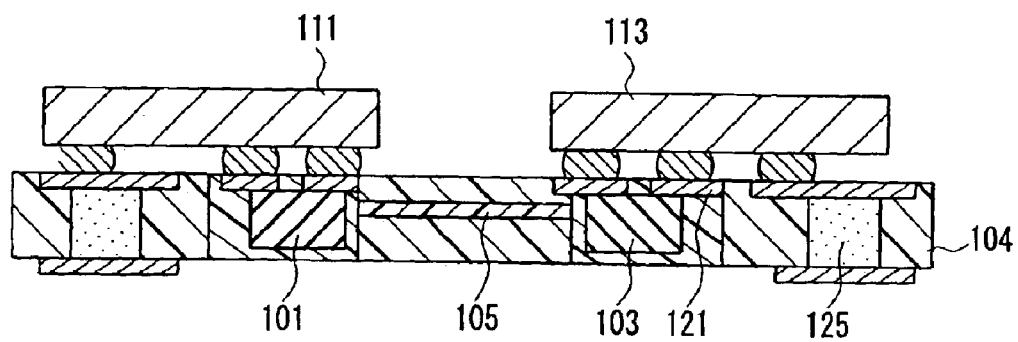
FIG. 8 is a cross-sectional view schematically showing an assembled member of a light reception/emission device built-in module with optical and electrical wiring combined therein according to Embodiment 3 of the present invention.

FIG. 8 is a cross-sectional view schematically showing an assembled member of a light reception/emission device built-in module with optical and electrical wiring combined therein according to Embodiment 3 of the present invention. The following describes the assembled member of the light reception/emission device built-in module with optical and electrical wiring combined therein according to this embodiment, with reference to FIG. 8. In this embodiment, a light reception device 101 is electrically connected with an amplification device 111 via a wiring pattern 121, and a light emission device 103 is electrically connected with a driving device 113 via a wiring pattern 121.

Figure 9:
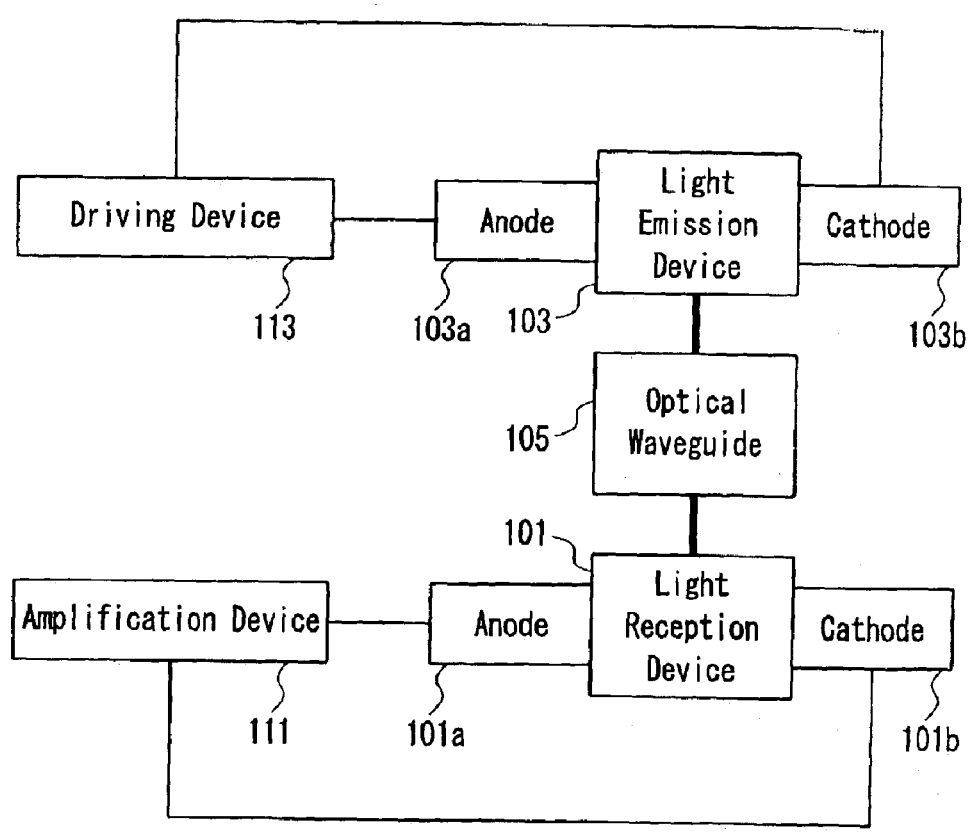
FIG. 9 schematically shows a circuit of an assembled member of a light reception/emission device built-in module with optical and electrical wiring combined therein according to Embodiment 3 of the present invention.

In particular, as for the electrical connection between the light reception device 101 or the light emission device 103 and the amplification device 103 or the driving device 113, as shown in FIG. 9, two terminals of an anode terminal 101a and a cathode terminal 101b of the light reception device 101 are both electrically connected with the amplification device, whereas two terminals of an anode terminal 103a and a cathode terminal 103b of the light emission device 103 are both electrically connected with the driving device. Preferably, the light reception device 101 and the light emission device 103 are optically connected with each other via an optical waveguide 105.

In this configuration, when the amplification device 111 and the driving device 113 are arranged so as to oppose the light reception device 101 and the light emission device 103, respectively, the wiring length can be shortened, whereby the cut-off frequency concerning the transmission properties can be increased. In addition, even when the amplification device 111 and the driving device 113 are arranged so as not to oppose the light reception device 101 and the light emission device 103, respectively, if the wiring is shorter than a wavelength of an electric signal that is transmitted between the driving device 113 and the light emission device 103 or between the amplification device 111 and the light reception device 101, the module can perform operations without degradation of the transmittance properties at high frequencies. The same applies to the case where a multilayer board is provided between the amplification device 111 or the driving device 113 and the light reception device 101 or the light emission device 103.

That is to say, as long as the module has the arrangement relationship of each of the devices like the configuration of a circuit diagram shown in FIG. 9, the present invention is not limited to the module configuration shown in FIG. 8. For instance, in order to electrically connect the amplification device 111 with the light reception device 101, other wiring patterns or via conductors may be used. However, if consideration is given to the transmittance properties, it is desirable to make the wiring length as short as possible, and therefore the module configuration as shown in FIG. 8 is preferable.

Furthermore, when insulation multilayer boards made of a mixture containing an inorganic filler and a thermosetting resin are provided on one, side or both sides of the optical waveguide layer 104, the wiring length can be shortened even in the configuration in which the amplification device 111 and the driving device 113 are arranged inside the insulation multilayer board and the amplification device 111 or the driving device 113 and the light reception device 101 or the light emission device 103 can be connected in a short distance. Therefore, if the wiring is shorter than a wavelength of a transmitted electric signal, the module can perform operations without degradation of the transmittance properties at high frequencies.

In particular, when the amplification device 111, the driving device 113, the light reception device 101 and the light emission device 103 are embedded and mounted in the optical waveguide layer and in the insulation multilayer board in a bare chip state, the degradation of reliability due to humidity can be avoided because these devices are isolated from the external atmosphere.

Furthermore, a material such as $Al_2O_3$, MgO, BN, SiC and AWN for an inorganic filler and a resin component are mixed to form the insulation multilayer board so that thermal expansion coefficients of the amplification device 111 and the driving device 113 match those of the light reception device 101 and the light emission device 103, the stress caused by thermal changes can be reduced. Also, the change in properties in accordance with thermal changes can be avoided.

Furthermore, when the module is configured to include a resistor device between the light emission device and the driving device, even in the case where the electrical wiring length between the light emission device and the driving device is made longer than a wavelength of a transmitted signal, the module can perform operations without degradation of the transmittance properties at high frequencies.

When a bypass capacitor is arranged between the light reception device and the amplification device, the bypass capacitor having an impedance lower than output impedance of the light reception device in the frequency band included in an electric signal output from the light reception device, even in the case where the electrical wiring length between the light reception device and the amplification device is made longer than a wavelength of a transmitted signal, the module can perform operations without degradation of the transmittance properties at high frequencies.

As for the configuration for arranging the capacitor, a chip form capacitor may be used so that the capacitor is embedded in the insulation multilayer board. Alternatively, the same effects can be obtained by providing a counter electrode inside the insulation multilayer board so as to form a capacitor element. When the capacitor element is formed by providing the counter electrode inside the insulation multilayer board, and if a configuration in which a material with a dielectric constant higher than that of the insulation multilayer board is provided at an interval with the counter electrode or a configuration in which the interval with the counter electrode is set at about 10 μm and the dimensions of the counter electrode are made smaller than ¼ of a wavelength of a transmitted signal, the module further can perform operations without degradation of the transmittance properties at higher frequencies.

As stated above, according to the assembled member of this embodiment, optical coupling can be conducted without using optical devices such as a reflective mirror between the optical device and the optical waveguide, circuit components can be packaged in the wiring board, on which optical wiring and electrical wiring are combined to be formed, using a normal surface packaging technology, and this embodiment can realize the assembled member operable even when signals transmitted between the optical device and a semiconductor device for driving the optical device or for amplifying the signals are at frequencies not less than several GHz.

Embodiment 4

Figure 10:
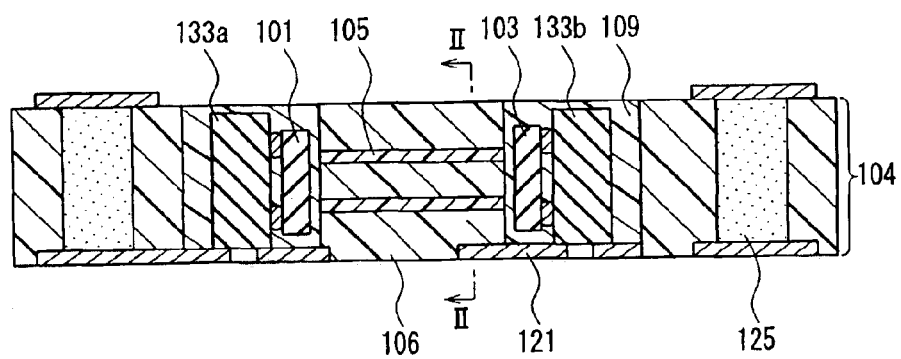
FIG. 10 is a cross-sectional view schematically showing a configuration of a light reception/emission device built-in module with optical and electrical wiring combined therein according to Embodiment 4 of the present invention.
Figure 11:
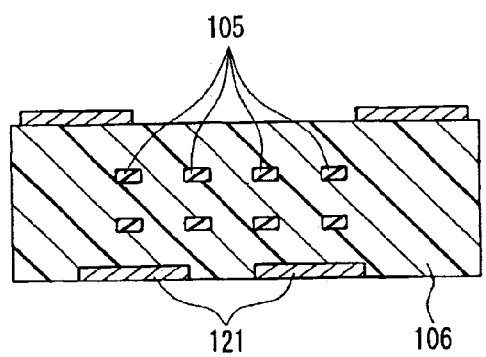
FIG. 11 is a cross-sectional view taken along line II—II of FIG. 10.

FIG. 10 is a cross-sectional view schematically showing a configuration of a light reception/emission device built-in module with optical and electrical wiring combined therein according to Embodiment 4 of the present invention, and FIG. 11 is a cross-sectional view taken along line II—II of FIG. 10. The following describes the light reception/emission device built-in module with optical and electrical wiring combined therein according to this embodiment, with reference to FIGS. 10 and 11. In this embodiment, a light reception device 101 is flip-chip packaged or face-up packaged on a sub carrier 133a via a bump, and is electrically connected with a wiring pattern formed on the sub carrier 133a. The sub carrier can be made of a ceramic material such as aluminum nitride, silicon carbide and alumina, and the sub carrier 133a is electrically connected with a wiring pattern 121 provided on a surface of the optical waveguide layer 104. In the light reception device 101, a plurality of light reception portions are provided in a same plane of a surface of the device and are optically coupled with a plurality of optical waveguide core portions 105 provided in the thickness direction of the optical waveguide layer 104. On the other hand, a light emission device 103 is flip-chip packaged on a sub carrier 133b. Alternatively, the light emission device 103 may be dice bonded onto the sub carrier 133b with solder and a conductive adhesive, and may be packaged using wire bonding between an electrode on the light emission device 103 and an electrode provided on the sub carrier. The sub carrier 133b includes the electrode formed on the side perpendicular to the surface on which the light emission device 103 is packaged, and the side electrode is electrically connected with the wiring pattern 121 provided on the surface of the optical waveguide layer 104. As the light emission device 103, for example, a surface emission type layer device can be used, on which a plurality of light emission portions are provided. The plurality of light emission portions respectively are optically coupled with the plurality of optical waveguide core portions 105 provided in the thickness direction of the optical waveguide layer 104. The wiring pattern 121 provided on the surface of the optical waveguide layer 104 is electrically connected with another surface of the optical waveguide layer 104 also via a via conductor 125. FIG. 11 illustrates the case where the plurality of optical waveguide core portions 105 are provided in an optical waveguide cladding portion 106, where two stages of the optical waveguide core portions are provided in the thickness direction. The optical waveguide core portions 105 may be provided at positions like lattice points. In this configuration, the light emission portions of the light emission device or the light reception portions of the light reception device also are provided in a similar manner so as to oppose the optical waveguide core portions 105 provided like lattice points as shown in FIG. 11. In addition, on the surface of the optical waveguide layer in which the optical waveguide core portions are provided, the wiring pattern 121 is provided. With this configuration, different signals can be transmitted between the light reception device and the light emission device using each of the plurality of optical waveguide core portions, and the optical waveguide core portions can be arranged with high density, thereby large-capacity signals can be transmitted.

Embodiment 5

Figure 12:
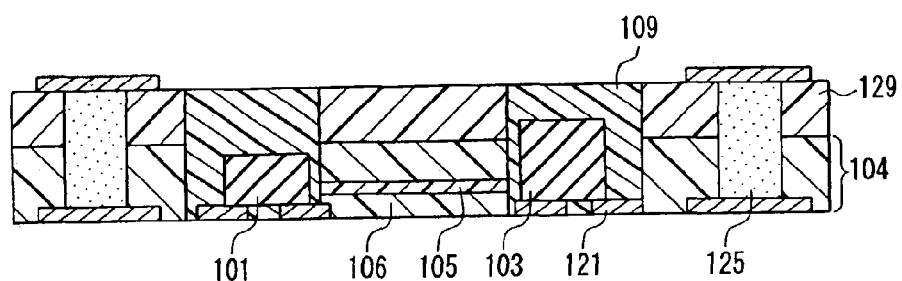
FIG. 12 is a cross-sectional view schematically showing a configuration of a light reception/emission device built-in module with optical and electrical wiring combined therein according to Embodiment 5 of the present invention.
Figure 13:
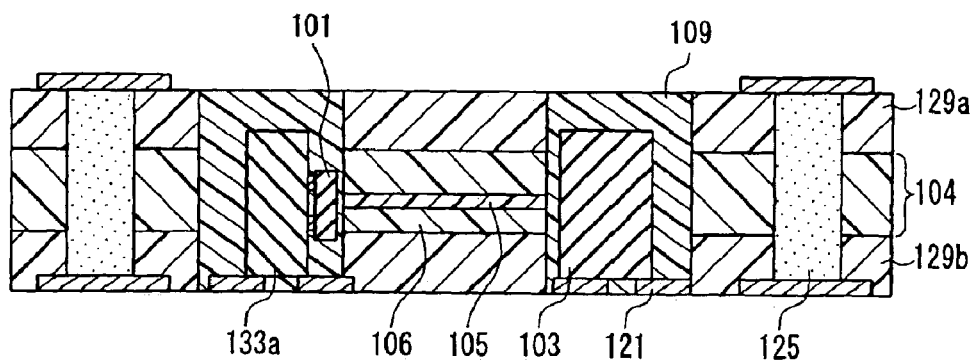
FIG. 13 is a cross-sectional view schematically showing a configuration of another light reception/emission device built-in module with optical and electrical wiring combined therein according to Embodiment 5 of the present invention.

FIGS. 12 and 13 are cross-sectional views schematically showing a configuration of a light reception/emission device built-in module with optical and electrical wiring combined therein according to Embodiment 5 of the present invention. The following describes the light reception/emission device built-in module with optical and electrical wiring combined therein according to this embodiment, with reference to FIGS. 12 and 13. In this embodiment, a light reception portion of a light reception device 101, an optical waveguide core portion 105 and a light emission portion of a light emission device 103 are arranged on a same plane, and the optical waveguide core portion 105 is optically coupled to the light reception device 101 and the light emission device 103. The light reception device 101 and the light emission device 103 are each electrically connected with a wiring pattern 121 provided on a surface of an optical waveguide layer 104. In addition, the light reception device 101 and the light emission device 103 are provided in through holes that are formed by integrating the optical waveguide layer 104 and the insulation board 129 and making holes therethrough. The surroundings of the light reception device 101 and the light emission device 103 are filled with a resin that matches the optical waveguide core portion 105 in refractive index and is transparent with respect to a wavelength of incoming and outgoing light to/from the light reception device 101 and the light emission device 103. The light reception device 101 and the light emission device 103 have a height larger than a thickness of the optical waveguide layer 104 but smaller than a thickness of the integration of the optical waveguide layer 104 and the insulation board 129. In particular, in FIG. 13, insulation boards 129a and 129b are provided on both sides of an optical waveguide layer 104, and a light reception device 101 and a light emission device 103 are provided in through holes that are formed by integrating the boards and the layer and making holes therethrough. The light reception device 101 is packaged on a sub carrier 133a, and, for example, is flip-chip packaged thereon. As the light reception device 101, a surface incident type photodiode and the like may be used. The sub carrier 133a with the light reception device packaged thereon has an electrode provided on the side thereof, and the electrode on the side is electrically connected with a wiring pattern 121 provided on a surface of the optical waveguide layer 104. The sub carrier 133a has a thickness thicker than a thickness of the optical waveguide layer 104, but has a height lower than a thickness of the integration of the optical waveguide layer 104 and the insulation board 129. With this configuration, a light reception device and a light emission device whose thickness is larger than that of an optical waveguide layer can be used, and a light reception/emission device built-in module with optical and electrical wiring combined therein can be configured without constraints whether a light emission portion and a light reception portion of the light reception/emission devices are located on an end face and on a surface. Therefore, the flexibility in the design can be enhanced.

Embodiment 6

Figure 14:
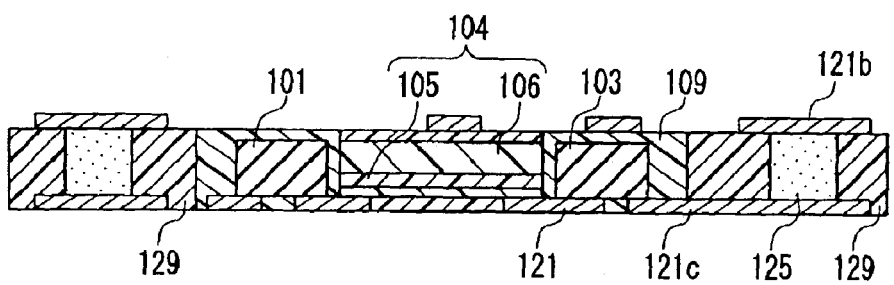
FIG. 14 is a cross-sectional view schematically showing a configuration of a light reception/emission device built-in module with optical and electrical wiring combined therein according to Embodiment 6 of the present invention.

FIG. 14 is a cross-sectional view schematically showing a configuration of a light reception/emission device built-in module with optical and electrical wiring combined therein according to Embodiment 6 of the present invention. The following describes the configuration of the light reception/emission device built-in module with optical and electrical wiring combined therein according to this embodiment, with reference to FIG. 14. In this embodiment, an optical waveguide layer 104 is provided inside an insulation board 129, and an optical waveguide core portion 105 in the optical waveguide layer 104 is optically coupled with a light reception device 101 and a light emission device 103. The optical waveguide layer 104 may be made of glass, in addition to the same materials as described above referring to FIG. 1. This drawing illustrates the case where the optical waveguide layer 104 is recessed relative to the insulation board 129 on two surfaces including a surface and a rear face of which wiring patterns 121 are provided. However, the thicker embodiment also is possible. In this case, the embodiment becomes a state where an optical waveguide layer is provided in a board having three or more wiring layers within which wiring patterns are provided. With this configuration, an optical waveguide layer can be selected freely without constraints on dimensions.

Figure 15:
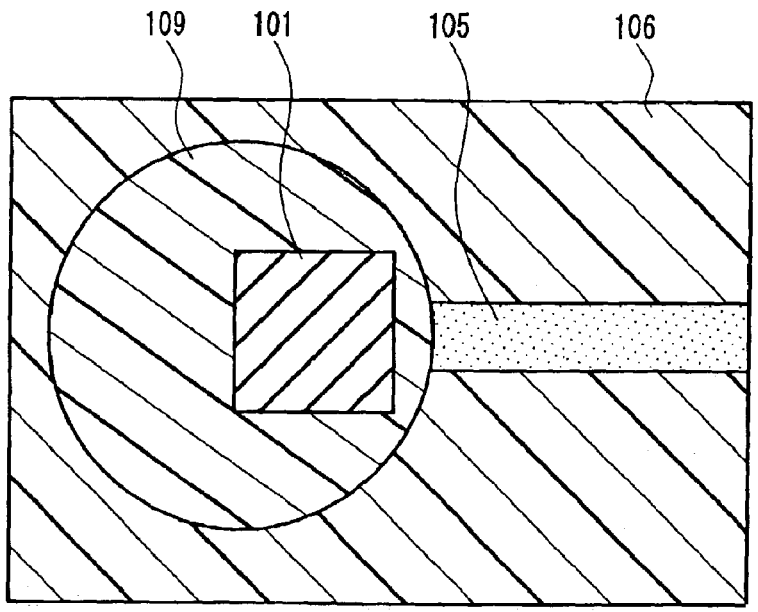
FIG. 15 is a cross-sectional view showing the optical coupling between the optical waveguide core portion and the light reception device according to Embodiment 6 of the present invention.

Next, referring to FIG. 15, the optical coupling portion between the optical waveguide core portion and the light reception device 101 will be described. The light reception device 101 is disposed in a circular through hole formed in the optical waveguide cladding portion 106, and the surrounding of the light reception device 101 is filled with a light-transmitting resin 109 that is transparent with respect to a wavelength of light received by the light reception device 101, where a resin with a refractive index higher than that of the optical waveguide cladding portion can be used. The refractive index of the light-transmitting resin 109 can be selected freely depending on a curvature of a surface with which the through hole and the optical waveguide core portion 105 contact. With this configuration, a lens effect resulting from the shape where the circular through hole and the optical waveguide cladding portion 106 contact with each other can improve the optical coupling efficiency between the optical waveguide cladding portion 106 and the light reception device 101. In this configuration, even when the light reception device is replaced with the light emission device, the same effects can be obtained.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A light reception/emission device built-in module with optical and electrical wiring combined therein, comprising:
   an optical waveguide layer comprising a core portion and a cladding portion;
   first and second wiring patterns formed on at least one of main surfaces of the optical waveguide layer;
   a light reception device disposed inside the optical waveguide layer, the light reception device being optically connected with the core portion of the optical waveguide layer and being electrically connected with the first wiring pattern; and
   a light emission device disposed inside the optical waveguide layer without a gap, the light emission device being optically connected with the core portion of the optical waveguide layer and being electrically connected with the second wiring pattern.

2. The module according to claim 1, wherein the light reception device and the light emission device are disposed in the optical waveguide layer so that optical input and output are conducted in a direction parallel to a plane on which the core portion of the optical waveguide layer is formed.

3. The module according to claim 1, wherein the light emission device is configured with a surface emission type laser.

4. The module according to claim 1, wherein an end face of the core portion of the optical waveguide layer is optically connected with the light reception device and the light emission device via a light-transmitting resin material.

5. The module according to claim 1, wherein a third wiring pattern is formed on the other main surface of the optical waveguide layer.

6. The module according to claim 5, wherein a circuit component is packaged on the third wiring pattern.

7. The module according to claim 1, further comprising an insulation board made of a mixture containing an inorganic filler and a thermosetting resin on at least one side of the optical waveguide layer.

8. The module according to claim 1, comprising a plurality of the core portions.

9. The module according to claim 8, wherein at least two core portions of the plurality of core portions are disposed on a same plane.

10. The module according to claim 8, wherein at least three end faces of end faces of the plurality of core portions are disposed on a same plane.

11. The module according to claim 8, wherein at least three end faces of end faces of the plurality of core portions are disposed on a substantially same line.

12. The module according to claim 1, comprising a plurality of the optical waveguide layers.

13. The module according to claim 12, wherein end faces of core portions of the plurality of optical waveguide layers have a concave form or a convex form.

14. The module according to claim 1, wherein the light reception device, the light emission device and the optical waveguide layer are all embedded in an electrical insulation layer.

15. A method for producing a light reception/emission device built-in module with optical and electrical wiring combined therein, comprising the steps of:
    forming a through hole in an optical waveguide layer comprising a core portion and a cladding portion;
    forming a plurality of wiring patterns on a main surface of a releasing film and packaging a light reception device and a light emission device on the wiring patterns;
    aligning the releasing film so that the wiring patterns face a side of the optical waveguide layer and overlaying the same on the optical waveguide layer, followed by application of pressure, so that the light reception device or the light emission device is disposed in the through hole in the optical waveguide layer;
    filling the through hole in which the light reception device or the light emission device has been disposed with a resin without a gap, the resin being transparent with respect to light propagating through the core portion; and
    curing the resin.

16. An assembled member including a light reception/emission device built-in module with optical and electrical wiring combined therein, comprising:
    an optical waveguide layer comprising a core portion and a cladding portion;
    first and second wiring patterns formed on at least one of main surfaces of the optical waveguide layer;
    a light reception device disposed inside the optical waveguide layer without a gap, the light reception device being optically connected with the core portion of the optical waveguide layer and being electrically connected with the first wiring pattern;
    a light emission device disposed inside the optical waveguide layer withput a gap, the light emission device being optically connected with the core portion of the optical waveguide layer and being electrically connected with the second wiring pattern; and
    a driving device and an amplification device that are packaged on the optical waveguide layer,
    wherein the light emission device is electrically connected with the driving device via the second wiring pattern and the light reception device is electrically connected with the amplification device via the first wiring pattern.

17. The assembled member including a module according to claim 16, wherein an anode terminal and a cathode terminal of the light emission device are both electrically connected with the driving device via the second wiring pattern and an anode terminal and a cathode terminal of the light reception device are both electrically connected with the amplification device via the first wiring pattern.

* * * * *

UNITED STATES PATENT AND TRADEMARK OFFICE
CERTIFICATE OF CORRECTION

PATENT NO.    : 6,885,788 B2
DATED         : April 26, 2005
INVENTOR(S)   : Iwaki et al.

It is certified that error appears in the above-identified patent and that said Letters Patent is hereby corrected as shown below:

Column 18,
Line 21, "withput" should read -- without --.

Signed and Sealed this

Twenty-third Day of May, 2006

JON W. DUDAS
*Director of the United States Patent and Trademark Office*

UNITED STATES PATENT AND TRADEMARK OFFICE
CERTIFICATE OF CORRECTION

PATENT NO. : 6,885,788 B2 Page 1 of 1
APPLICATION NO. : 10/609494
DATED : April 26, 2005
INVENTOR(S) : Iwaki et al.

It is certified that error appears in the above-identified patent and that said Letters Patent is hereby corrected as shown below:

Title page of the patent, (56) References cited, Foreign patent documents:

"JP 2001-36197  2/2000" should read --JP 2001-36197 2/2001--

Signed and Sealed this

Thirty-first Day of October, 2006

JON W. DUDAS
*Director of the United States Patent and Trademark Office*